(12) United States Patent  
Laib

(10) Patent No.: US 12,274,006 B2  
(45) Date of Patent: Apr. 8, 2025

(54) PRINTED CIRCUIT BOARD WITH MOLD ADHESION BOUNDARY FOR DIE ATTACH PAD

(71) Applicant: Skyworks Solutions, Inc., Irvine, CA (US)

(72) Inventor: Andrew Christopher Laib, Fullerton, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 250 days.

(21) Appl. No.: 18/167,662

(22) Filed: Feb. 10, 2023

(65) Prior Publication Data

US 2023/0262901 A1 Aug. 17, 2023

Related U.S. Application Data

(60) Provisional application No. 63/267,988, filed on Feb. 14, 2022.

(51) Int. Cl.  
*H05K 1/11* (2006.01)  
*H05K 1/18* (2006.01)  
*H05K 3/34* (2006.01)

(52) U.S. Cl.  
CPC ............ *H05K 1/185* (2013.01); *H05K 1/111* (2013.01); *H05K 3/3452* (2013.01); *H05K 2201/03* (2013.01); *H05K 2201/10098* (2013.01)

(58) Field of Classification Search  
CPC ........ H05K 1/185; H05K 1/186; H05K 1/187; H05K 1/188; H05K 1/111  
See application file for complete search history.

(56) References Cited

U.S. PATENT DOCUMENTS

2018/0116057 A1* 4/2018 Kajihara .............. H05K 3/0032  
2022/0319943 A1* 10/2022 Mok ..................... H05K 1/186  
2023/0328886 A1* 10/2023 Shin .................... H01L 21/4857  
174/260

* cited by examiner

*Primary Examiner* — Jeremy C Norris  
(74) *Attorney, Agent, or Firm* — Knobbe, Martens, Olson & Bear LLP

(57) ABSTRACT

A printed circuit board for use in an electronics package has a die attach pad and one or more adhesion strips outside the die attach pad. The adhesion strip(s) facilitate adhesion of a mold compound over the die attach pad and die and inhibits (e.g., prevents) delamination of the mold compound from the die attach pad.

24 Claims, 9 Drawing Sheets

PRINTED CIRCUIT BOARD WITH MOLD ADHESION BOUNDARY FOR DIE ATTACH PAD

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to electronic packages and, more specifically, to printed circuit boards with mold adhesion strip(s) for die attach pads and electronic packages having the same.

Description of Related Technology

Circuit devices, such as radio frequency modules, can be implemented in a packaged module. Such devices can include wafer level chip scale packages (WLCSPs) that be connected to a printed circuit board of the package module. For example, dies can be attached to the printed circuit board (PCB) using a conductive die attach pad on the printed circuit board, with an epoxy disposed between the die and die attach pad to attach the die to the die attach pad. The circuit devices can be overmolded and shielded. However, mold compound poorly adheres to the die attach pad material. The mold compound can delaminate from the die attach pad, pulling the whole die with the epoxy off the die attach pad (e.g., when the die is in tension from the mold compound pulling up on the die), or when a crack propagates from outside the die toward the center of the die, thereby causing a broken electrical connection. Additionally, different materials have different coefficients of thermal expansion (CTE), which can result in the mold compound delaminating from the PCB for certain components that experience large differences in CTE.

SUMMARY

The innovations described in the claims each have several aspects, no single one of which is solely responsible for its desirable attributes. Without limiting the scope of the claims, some prominent features of this disclosure will now be briefly described.

In accordance with one aspect of the disclosure, a printed circuit board for use in an electronics package has a die attach pad and one or more adhesion strips outside the die attach pad to facilitate adhesion of a mold compound over the die attach pad that inhibits (e.g., prevents) delamination of the mold compound from the die attach pad.

In accordance with another aspect of the disclosure, a method of making a printed circuit board for use in an electronics package includes forming or providing a printed circuit board solder mask, forming or providing a die attach pad bounded by the printed circuit board solder mask, and forming or providing one or more adhesion strips outside an outer boundary of the die attach pad and between the die attach pad and the printed circuit board solder mask. The one or more adhesion strips facilitate adhesion of a mold compound over the die attach pad to inhibits (e.g., prevents) delamination of the mold compound from the die attach pad. In one implementation, forming or providing the one or more adhesion strips includes exposing the adhesion boundari(es) (e.g., by etching at least a portion of the die attach pad). In another implementation, forming or providing the one or more adhesion strips includes adding a layer of material outside the outer boundary of the die attach pad that facilitates adhesion with mold compound material.

In accordance with one aspect of the disclosure, an electronics package for use in a module of an electronic device is provided. The electronics package includes a printed circuit board including an attachment pad configured to receive a circuit device thereon, and a printed circuit board solder mask disposed circumferentially about the attachment pad. One or more adhesion strips are disposed between the attachment pad and the printed circuit board solder mask, the one or more adhesion strips extending around at least a portion of the attachment pad, the one or more adhesion strips configured to facilitate adhesion of a mold compound thereto and over the circuit device and to inhibit delamination of the mold compound.

In accordance with another aspect of the disclosure, a module for an electronic device is provided. The module comprises a package substrate and an electronics package mounted on the package substrate. The electronics package includes a printed circuit board that includes an attachment pad configured to receive a circuit device thereon and a printed circuit board solder mask disposed circumferentially about the attachment pad. One or more adhesion strips are disposed between the attachment pad and the printed circuit board solder mask, the one or more adhesion strips extending around at least a portion of the attachment pad. The one or more adhesion strips are configured to facilitate adhesion of a mold compound thereto and over the circuit device and to inhibit delamination of the mold compound. The module also includes additional circuitry, the electronics package and the additional circuitry disposed on the package substrate.

In accordance with another aspect of the disclosure, a wireless electronic device is provided. The wireless electronic device includes an antenna and a front end module including one or more electronics packages. Each electronics package includes a printed circuit board that includes an attachment pad configured to receive a circuit device thereon and a printed circuit board solder mask disposed circumferentially about the attachment pad. One or more adhesion strips are disposed between the attachment pad and the printed circuit board solder mask, the one or more adhesion strips extending around at least a portion of the attachment pad. The one or more adhesion strips are configured to facilitate adhesion of a mold compound thereto and over the circuit device and to inhibit delamination of the mold compound.

BRIEF DESCRIPTION OF THE DRAWINGS

Embodiments of this disclosure will now be described, by way of non-limiting example, with reference to the accompanying drawings.

DETAILED DESCRIPTION

Figure 1:
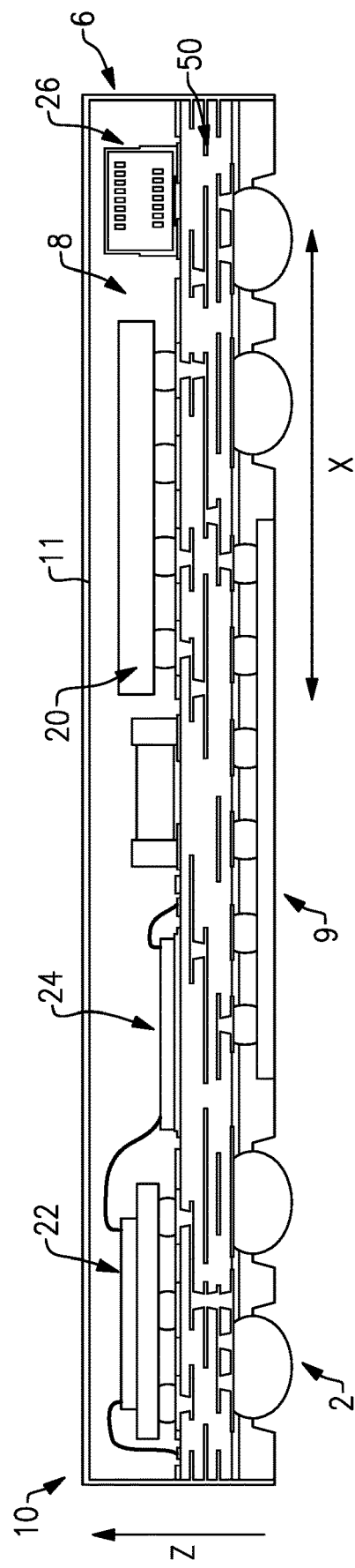
FIG. 1 is a schematic view of a dual sided package module with various electronic components.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 shows a duel sided package 10 with one or more (a plurality of) solder connections (e.g., balls, or other electrical interconnect members) 2 that are connected to an underside of a printed circuit board (PCB) 50. A plurality of electronic components 6 are connected to a top side of the PCB 50, including a wafer level chip scale package (WLCSP) 20, a flip stack 22, a die 24 and a surface mount technology (SMT) package 26. Wirebonds can connect different components. Overmold 8 can be disposed over the electronic components 6. A shield 11 is disposed over the overmold 8 to shield all of the electronic components 6 from electromagnetic (EM) interference from components outside the shield 11. The package 10 can be mounted on a phone board or motherboard of an electronic device.

Figure 2:
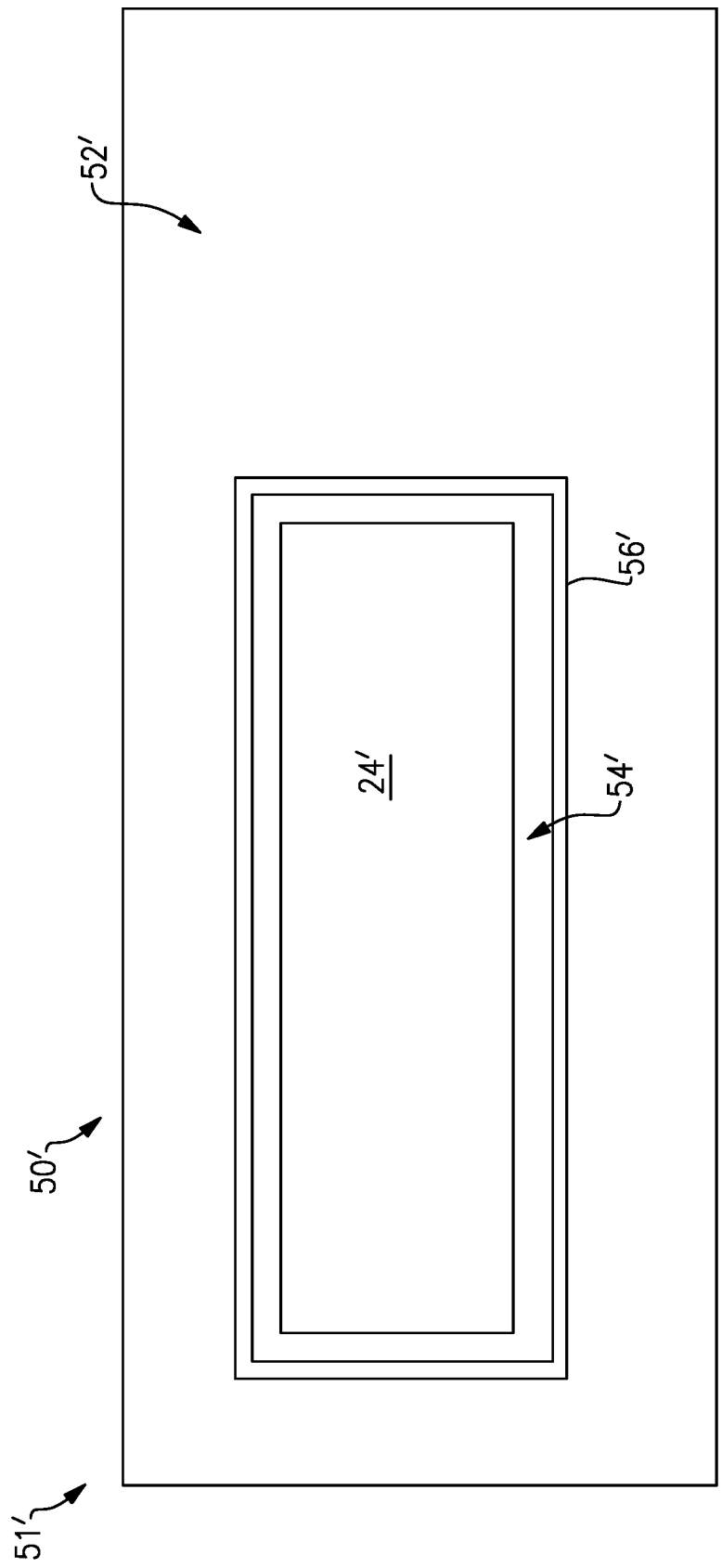
FIG. 2 is a schematic view of a printed circuit board for use in a package module, such as the package module in FIG. 1.

FIG. 2 shows a body 51' of a printed circuit board (PCB) 50' for mounting a circuit device (e.g., a die, SMT package) 24' thereon. The PCB 50' can be similar to the PCB 50, except as described below. The body 51' of the PCB 50' includes a PCB solder mask 52' that surrounds an attach pad (e.g., die attach pad) 54' on which a circuit device (e.g., die, SMT package, filter package) 24' can be mounted. As discussed above, the circuit device (e.g., die, SMT package, filter package) 24' can be mounted on the attach pad 54' via a conductive epoxy interposed between the circuit device (e.g., die, SMT package, filter package) 24' and the attach pad 54'. The attach pad 54' can provide a conductive connection between the epoxy and metal (e.g., copper (Cu)) layers of the PCB 50'. In one implementation, the attach pad 54' is made of gold (Au). In another implementation, the attach pad 54' is made of silver (Ag). However, the attach pad 54' can be made of other suitable conductive materials. The attach pad 54' can have a larger area than the circuit device (e.g., die, SMT package, filter package) 24', to allow epoxy that may runout or extend from under the circuit device 24' to remain on the attach pad 54'.

With continued reference to FIG. 2, the body 51' includes an adhesion strip 56' that is outward of the outer boundary of the attach pad 54'. The adhesion strip 56' is between the attach pad 54' and the PCB solder mask 52'. In the illustrated embodiment, the adhesion strip 56' circumscribes (e.g., continuously surrounds, completely surrounds) or extends around the perimeter of the attach pad 54'. In one implementation, the adhesion strip 56' can be exposed metal (e.g., copper (Cu)) material. In another implementation, the adhesion strip 56' can be an etched or roughened surface (e.g., of gold (Au)). In one implementation, the adhesion strip 56' is of a different material than the attach pad 54'. Advantageously, the adhesion strip 56' promotes adhesion of the mold compound 8 on the PCB 50' (e.g., over the attach pad 54') and/or inhibits (e.g., prevents) delamination of the mold compound 8 from over the attach pad 54'. In particular, where the mold compound can delaminate from a circuit device because it does not adhere well to an attach pad or due to mismatch (e.g. large differences) in coefficient of thermal expansion between the mold compound and a component, for example where the circuit device 24' is a die (such as die 24 in FIG. 1) or an SMT package (such as SMT package 26 in FIG. 1) or a filter package, the adhesion strip 56' can inhibit (e.g., prevent) delamination of the mold compound 8 from over the attach pad 54'.

Figure 3:
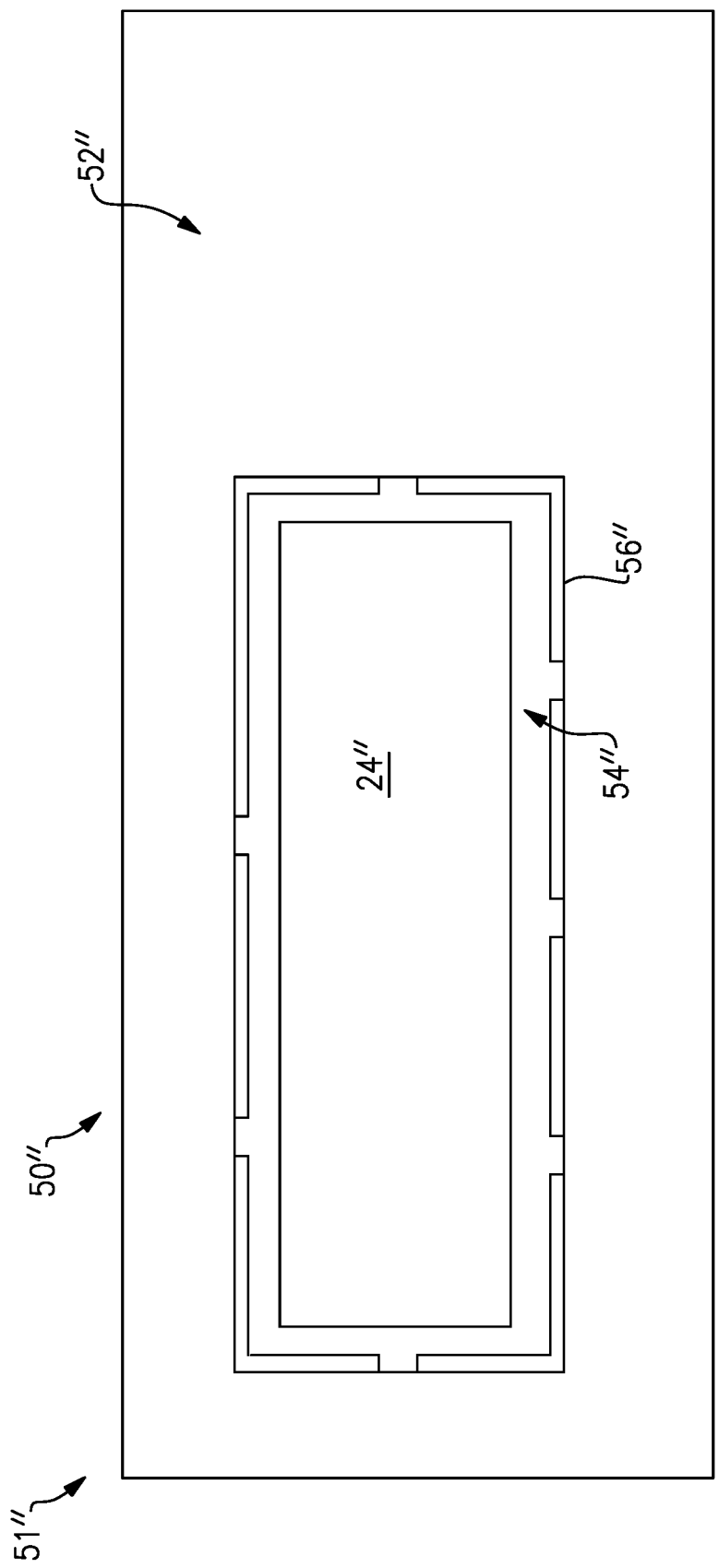
FIG. 3 is a schematic view of a printed circuit board for use in a package module, such as the package module in FIG. 1.

FIG. 3 shows a body 51" of a printed circuit board (PCB) 50" for mounting a circuit device (e.g., a die, SMT package) 24" thereon. Some of the features of the body 51" and package 50" are similar to features of the body 51' and PCB 50' in FIG. 2. Thus, reference numerals used to designate the various components of the body 51" and PCB 50" are identical to those used for identifying the corresponding components of the body 51' and PCB 50' in FIG. 2, except that an "'" has been added to the numerical identifier. Therefore, the structure and description for the various features of the body 51' and PCB 50' in FIG. 2, which are based on the description of the PCB 50 in FIG. 1, are understood to also apply to the corresponding features of the body 51" and PCB 50" in FIG. 3, except as described below.

The body 51" and PCB 50" differs from the body 51' and PCB 50' in that the adhesion strip 56" is not continuous. Rather, the adhesion strip 56" has multiple segments spaced from each other and between an outer boundary of the attach pad 54" and the PCB solder mask 52". In one implementation, only the corners of the attach pad 54" have an adhesion strip 56" between the attach pad 54" and the PCB solder mask 52".

Figure 4:
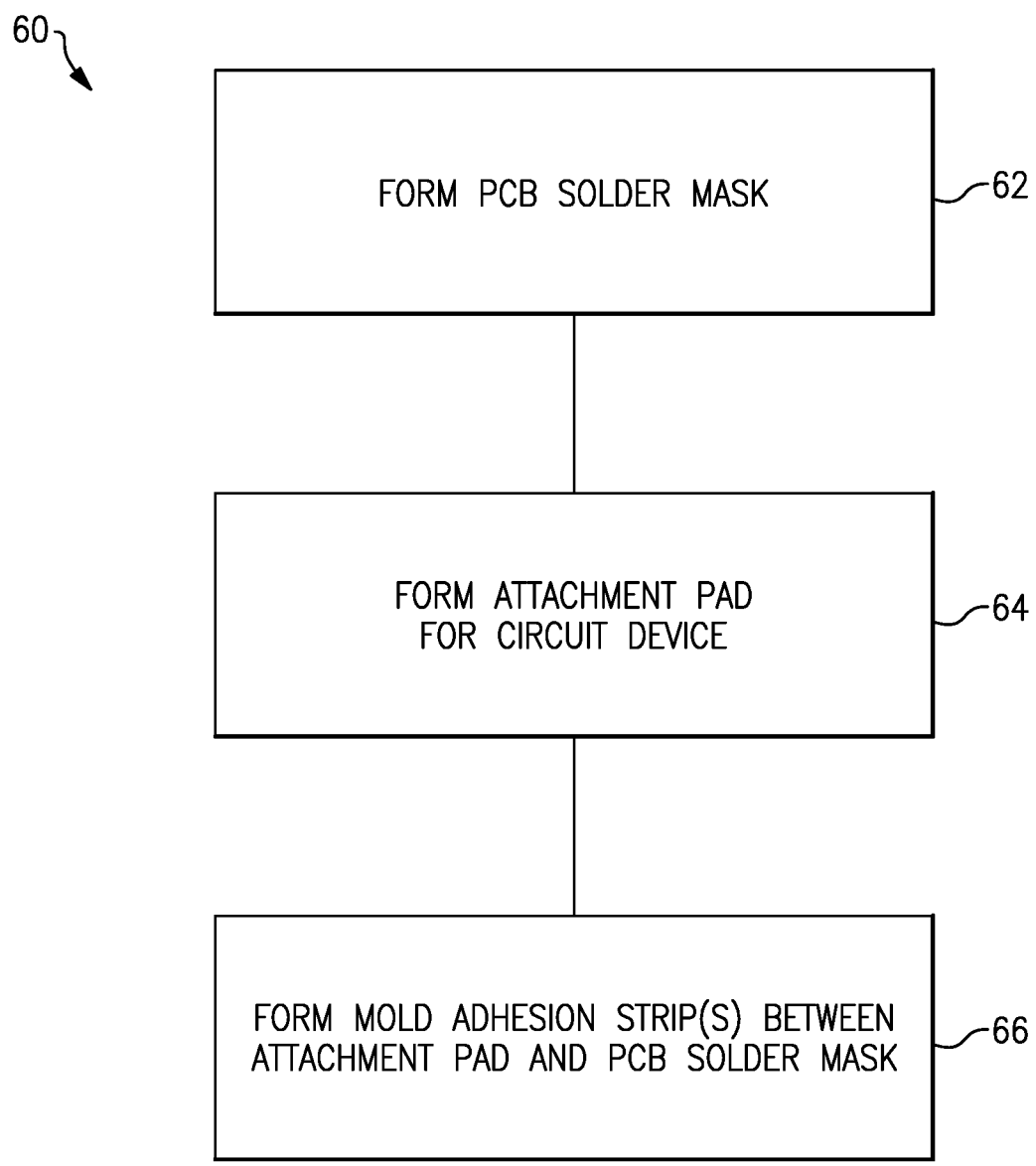
FIG. 4 shows a process for forming a printed circuit board for use in a package module, such as the package module of FIG. 1.

FIG. 4 shows a method 60 of making a PCB, such as the PCB 50' or 50". The method 60 includes the step of forming or providing 62 a PCB solder mask. The method 60 also includes the step of forming 64 an attachment for a circuit device (e.g., die, SMT package, filter package). The method 60 also includes the step of forming or providing 66 one or more mold adhesion strip(s) outside (e.g., an outer boundary of) the attachment pad and between the attachment pad and PCB solder mask. For example, the one or more mold adhesion strip(s) can be formed or provided 66 over the PCB solder mask and/or the attachment pad. In another implementation, forming or providing the one or more mold adhesion strip(s) includes roughening a surface outside an outer boundary of the attachment pad (e.g., a surface of gold (Au)). In one implementation, forming or providing 66 the one or more mold adhesion strip(s) includes forming a single continuous mold adhesion strip that circumscribes (e.g., surrounds, extends around a periphery of) the attachment pad. In another implementation, forming or providing 66 the one or more mold adhesion strip(s) includes forming a plurality of mold adhesion strips that are spaced from each other and together extend around a periphery of the attachment pad.

Figure 5:
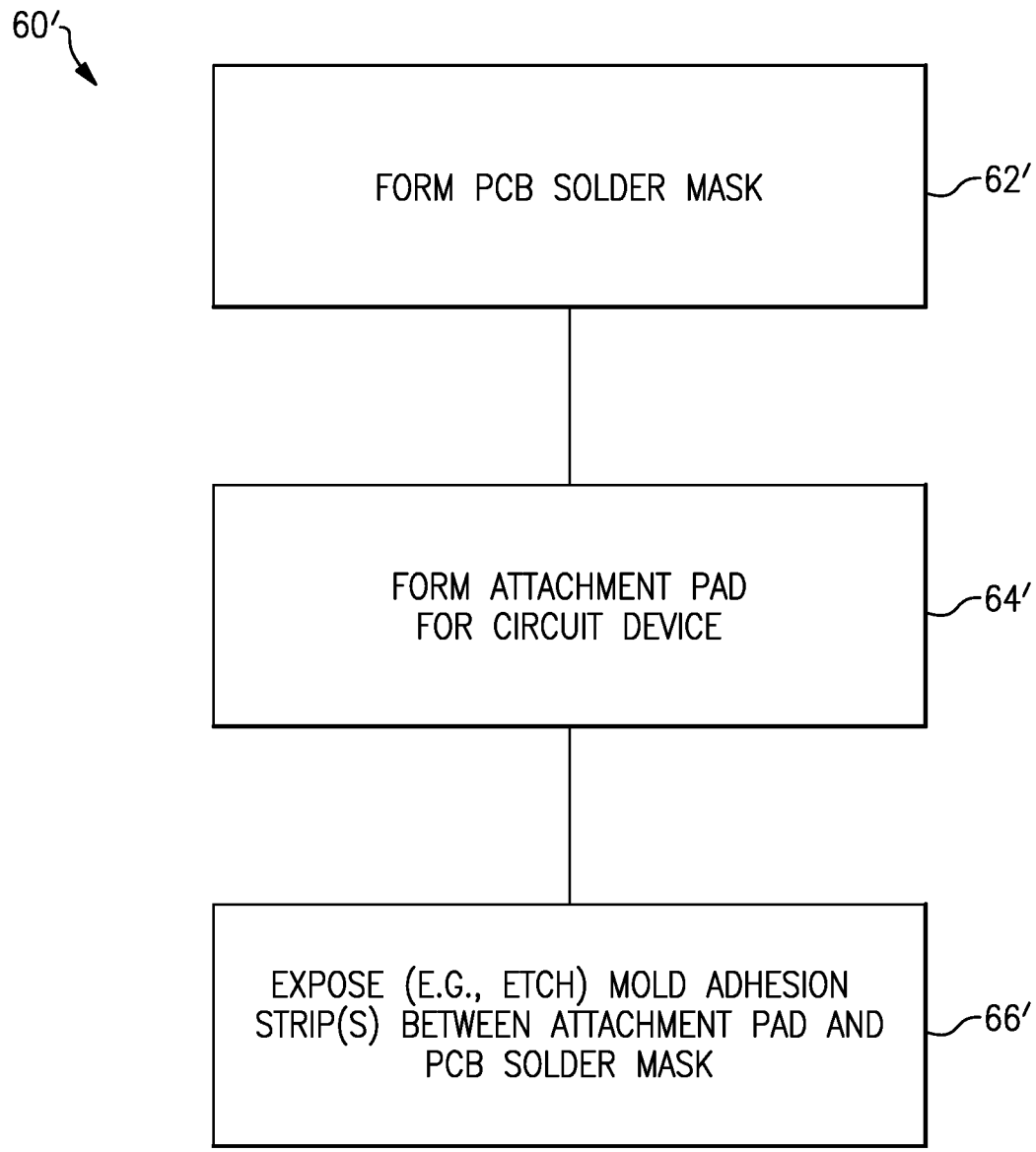
FIG. 5 shows a process for forming a printed circuit board for use in a package module, such as the package module of FIG. 1.

FIG. 5 shows a method 60' of making a PCB, such as the PCB 50' or 50". The method 60' is similar to the method 60 in FIG. 4. Thus, reference numerals used to designate the various steps of the method 60' are identical to those used for identifying the corresponding steps of the method 60 in FIG. 4, except that an "'" has been added to the numerical identifier. Therefore, the description for the various steps of the method 60 in FIG. 4 are understood to also apply to the corresponding features of the method 60' in FIG. 5, except as described below.

The method 60' differs from the method 60 in that forming or providing 66' the one or more mold adhesion strip(s) includes exposing (e.g., etching) a material (e.g., a metal, such as copper (Cu)). In one example, one or both of a PCB solder mask and an attachment pad can be etched to expose the one or more mold adhesion strip(s).

Figure 6:
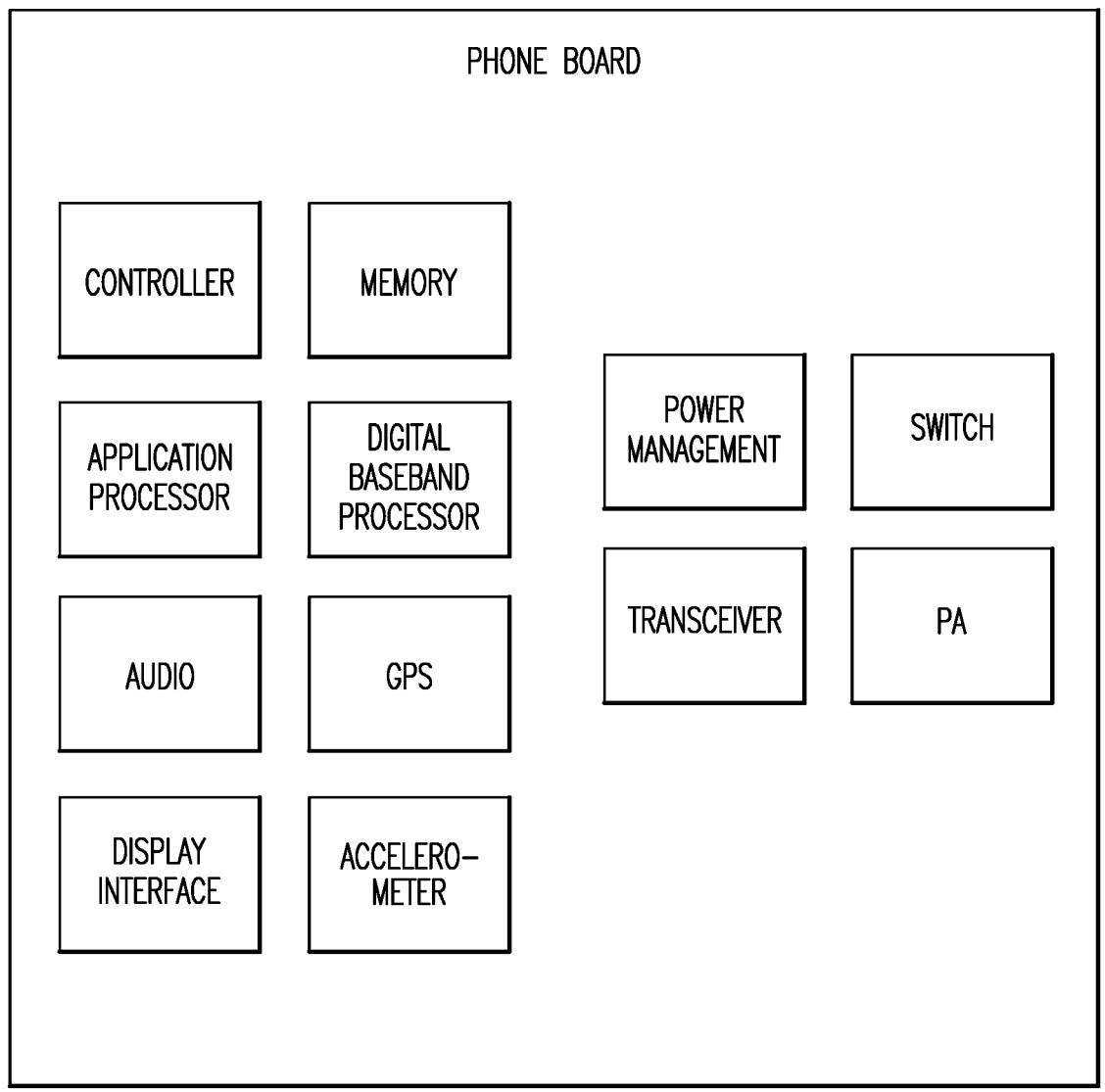
FIG. 6 shows one or more of modules that are mounted on a wireless phone board that can include one or more features described herein.

FIG. 6 shows that in some embodiments, one or more modules included in a circuit board such as a wireless phone board can include one or more dies attached on die attach pad of a printed circuit board as described herein. Non-limiting examples of modules that can benefit from such packaging features include, but are not limited to, a controller module, an application processor module, an audio module, a display interface module, a memory module, a digital baseband processor module, a global positioning system (GPS) module, an accelerometer module, a power management module, a transceiver module, a switching module, and a power amplifier module.

Figure 7:
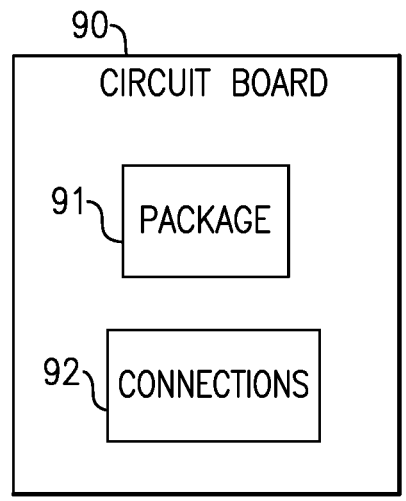
FIG. 7 schematically depicts the circuit board with the shielded wafer level chip scale package installed thereon.
Figure 8:
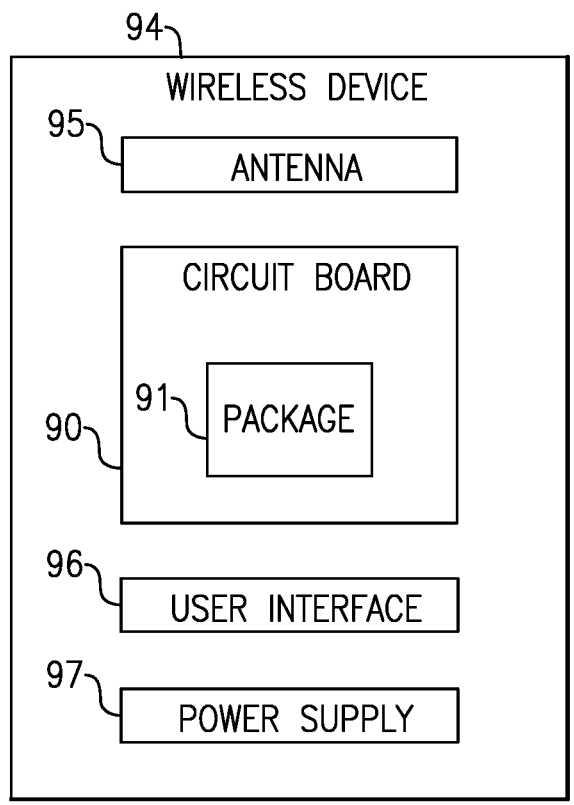
FIG. 8 schematically depicts a wireless device having the circuit board with the shielded wafer level chip scale package installed thereon.

FIG. 7 schematically depicts a circuit board 90 having a package (e.g., die, SMT package, filter) 91 mounted thereon in the manner described herein. The circuit board 90 can also include other features such as a plurality of connections 92 to facilitate operations of various packages mounted thereon. FIG. 8 schematically depicts a wireless device 94 (e.g., a cellular phone) having a circuit board 90 (e.g., a phone board). The circuit board 90 is shown to include a package (e.g., die, SMT package, filter) 91 mounted thereon in the manner described herein. The wireless device is shown to further include other components, such as an antenna 95, a user interface 96, and a power supply 97.

Figure 9:
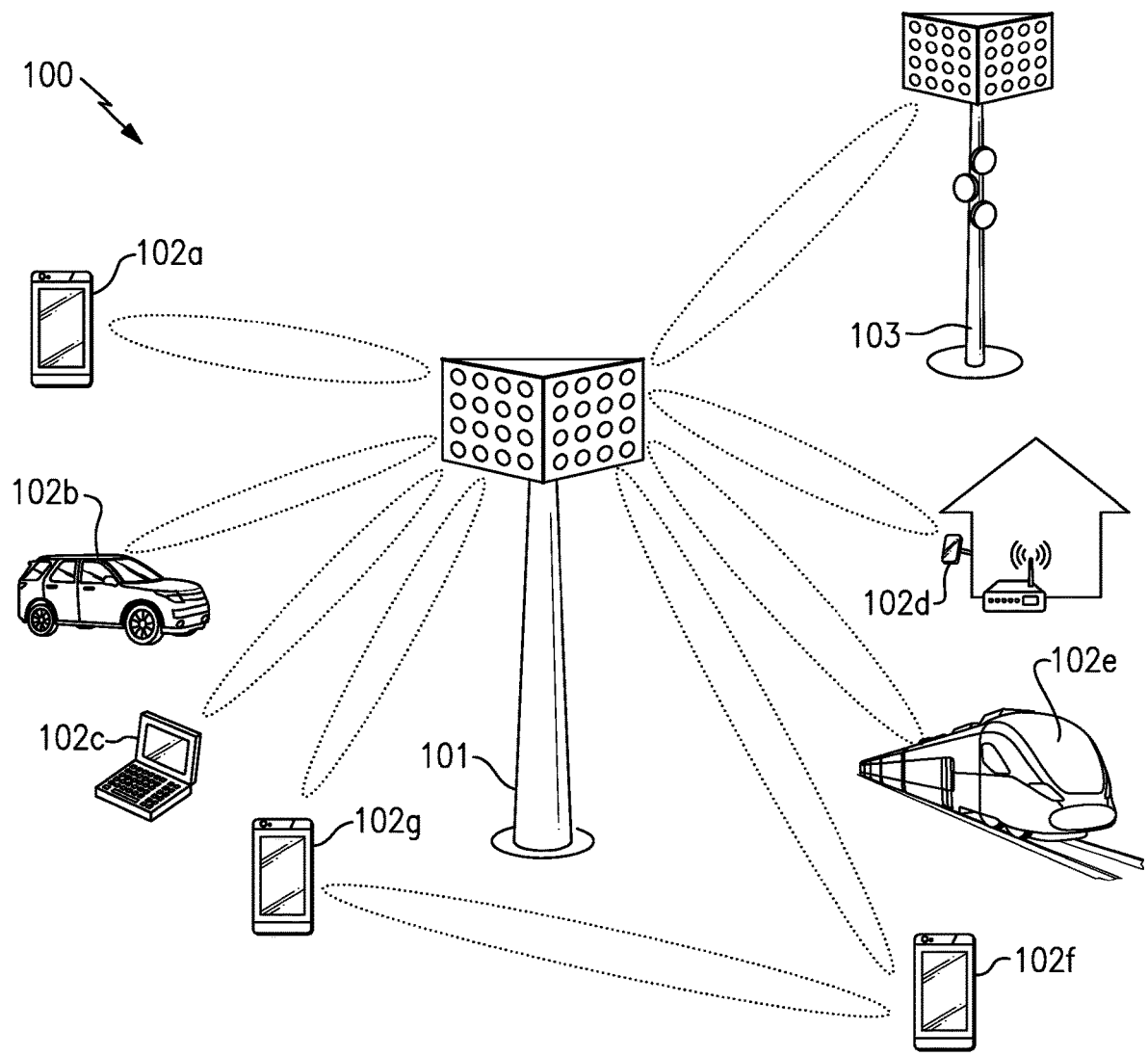
FIG. 9 is a schematic diagram of one example of a communication network.

FIG. 9 is a schematic diagram of one example of a communication network 100. The communication network 100 includes a macro cell base station 101, a small cell base station 103, and various examples of user equipment (UE), including a first mobile device 102a, a wireless-connected car 102b, a laptop 102c, a stationary wireless device 102d, a wireless-connected train 102e, a second mobile device 102f, and a third mobile device 102g.

Although specific examples of base stations and user equipment are illustrated in FIG. 9, a communication network can include base stations and user equipment of a wide variety of types and/or numbers.

For instance, in the example shown, the communication network 100 includes the macro cell base station 101 and the small cell base station 103. The small cell base station 103 can operate with relatively lower power, shorter range, and/or with fewer concurrent users relative to the macro cell base station 101. The small cell base station 103 can also be referred to as a femtocell, a picocell, or a microcell. Although the communication network 100 is illustrated as including two base stations, the communication network 100 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 100 of FIG. 9 supports communications using a variety of cellular technologies, including, for example, 4G LTE and 5G NR. In certain implementations, the communication network 100 is further adapted to provide a wireless local area network (WLAN), such as WiFi. Although various examples of communication technologies have been provided, the communication network 100 can be adapted to support a wide variety of communication technologies.

Various communication links of the communication network 100 have been depicted in FIG. 9. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 9, the communication links include not only communication links between UE and base stations, but also UE to UE communications and base station to base station communications. For example, the communication network 100 can be implemented to support self-fronthaul and/or self-backhaul (for instance, as between mobile device 102g and mobile device 102f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1) in the range of about 410 MHz to about 7.125 GHz, Frequency Range 2 (FR2) in the range of about 24.250 GHz to about 52.600 GHz, or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 100 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 100 of FIG. 9 can be used to support a wide variety of advanced communication features, including, but not limited to, eMBB, uRLLC, and/or mMTC.

Figure 10:
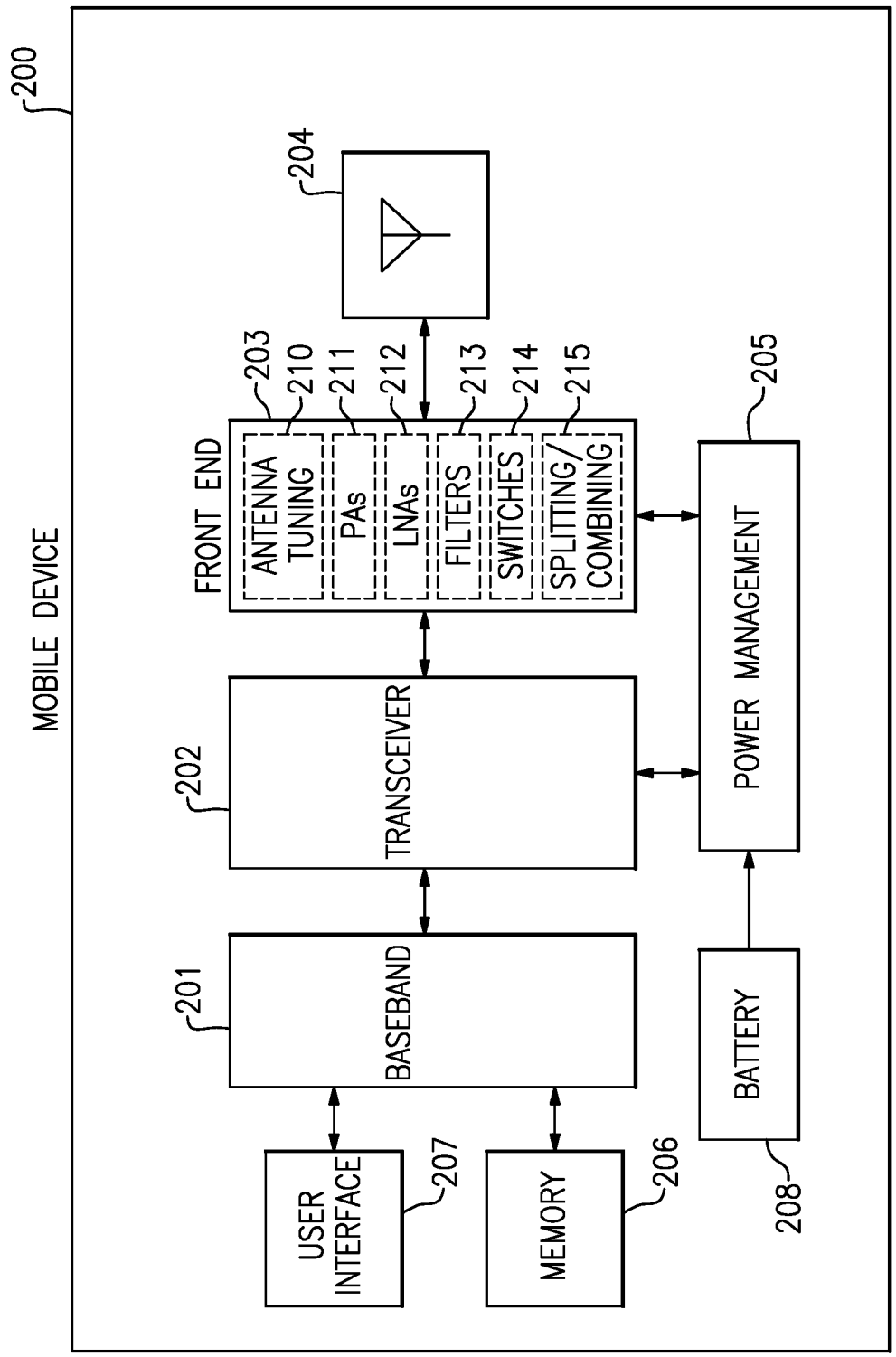
FIG. 10 is a schematic diagram of one embodiment of a mobile device.

FIG. 10 is a schematic diagram of one embodiment of a mobile device 200. The mobile device 200 includes a baseband system 201, a transceiver 202, a front end system 203, antennas 204, a power management system 205, a memory 206, a user interface 207, and a battery 208.

The mobile device 200 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 202 generates RF signals for transmission and processes incoming RF signals received from the antennas 204. It will be understood that various functionalities associated with the transmission and receiving of RF signals can be achieved by one or more components that are collectively represented in FIG. 10 as the transceiver 202. In one example, separate components (for instance, separate circuits or dies) can be provided for handling certain types of RF signals.

The front end system 203 aids in conditioning signals transmitted to and/or received from the antennas 204. In the illustrated embodiment, the front end system 203 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 203 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 200 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 204 can include antennas used for a wide variety of types of communications. For example, the antennas 204 can include antennas for transmitting and/or receiving signals associated with a wide variety of frequencies and communications standards.

In certain implementations, the antennas 204 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 200 can operate with beamforming in certain implementations. For example, the front end system 203 can include amplifiers having controllable gain and phase shifters having controllable phase to provide beam formation and directivity for transmission and/or reception of signals using the antennas 204. For example, in the context of signal transmission, the amplitude and phases of the transmit signals provided to the antennas 204 are controlled such that radiated signals from the antennas 204 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 204 from a particular direction. In certain implementations, the antennas 204 include one or more arrays of antenna elements to enhance beamforming.

The baseband system 201 is coupled to the user interface 207 to facilitate processing of various user input and output (I/O), such as voice and data. The baseband system 201 provides the transceiver 202 with digital representations of transmit signals, which the transceiver 202 processes to generate RF signals for transmission. The baseband system 201 also processes digital representations of received signals provided by the transceiver 202. As shown in FIG. 10, the baseband system 201 is coupled to the memory 206 of facilitate operation of the mobile device 200.

The memory 206 can be used for a wide variety of purposes, such as storing data and/or instructions to facilitate the operation of the mobile device 200 and/or to provide storage of user information.

The power management system 205 provides a number of power management functions of the mobile device 200. In certain implementations, the power management system 205 includes a PA supply control circuit that controls the supply voltages of the power amplifiers 811. For example, the power management system 205 can be configured to change the supply voltage(s) provided to one or more of the power amplifiers 811 to improve efficiency, such as power added efficiency (PAE).

As shown in FIG. 10, the power management system 205 receives a battery voltage from the battery 208. The battery 208 can be any suitable battery for use in the mobile device 200, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronics package for use in a module of an electronic device comprising:
    a printed circuit board including an attachment pad configured to receive a circuit device thereon, the printed circuit board further including a printed circuit board solder mask disposed circumferentially about the attachment pad; and
    one or more adhesion strips disposed between the attachment pad and the printed circuit board solder mask, the one or more adhesion strips extending around at least a portion of the attachment pad, the one or more adhesion strips configured to facilitate adhesion of a mold compound thereto and over the circuit device and to inhibit delamination of the mold compound.

2. The package of claim 1 wherein the one or more adhesion strips include a single continuous adhesion strip that extends around an entire periphery of the attachment pad.

3. The package of claim 1 wherein the one or more adhesion strips are a plurality of adhesion strips that are spaced from each other and extend around a periphery of the attachment pad.

4. The package of claim 1 wherein the attachment pad has an area that is greater than a projected area of the circuit device.

5. The package of claim 1 wherein the circuit device is chosen from a group consisting of a die, a surface mount technology package and a filter package.

6. The package of claim 1 wherein the one or more adhesion strips are of a different material than the attachment pad.

7. The package of claim 1 wherein the one or more adhesion strips include an etched or roughened surface.

8. The package of claim 1 wherein the one or more adhesion strips are made of a metal material.

9. A module for an electronic device comprising:
    a package substrate;
    an electronics package mounted on the package substrate, the electronics package including a printed circuit board that includes an attachment pad configured to receive a circuit device thereon, a printed circuit board solder mask disposed circumferentially about the attachment pad, and one or more adhesion strips disposed between the attachment pad and the printed circuit board solder mask, the one or more adhesion strips extending around at least a portion of the attachment pad, the one or more adhesion strips configured to facilitate adhesion of a mold compound thereto and over the circuit device and to inhibit delamination of the mold compound; and
    additional circuitry, the electronics package and the additional circuitry disposed on the package substrate.

10. The module of claim 9 wherein the one or more adhesion strips include a single continuous adhesion strip that extends around an entire periphery of the attachment pad.

11. The module of claim 9 wherein the one or more adhesion strips are a plurality of adhesion strips that are spaced from each other and extend around a periphery of the attachment pad.

12. The module of claim 9 wherein the attachment pad has an area that is greater than a projected area of the circuit device.

13. The module of claim 9 wherein the circuit device is chosen from a group consisting of a die, a surface mount technology package and a filter package.

14. The module of claim 9 wherein the one or more adhesion strips are of a different material than the attachment pad.

15. The module of claim 9 wherein the one or more adhesion strips include an etched or roughened surface.

16. The module of claim 9 wherein the one or more adhesion strips are made of a metal material.

17. A wireless electronic device comprising:
    an antenna; and
    a front end module including one or more electronics packages, each electronics package including a printed circuit board that includes an attachment pad configured to receive a circuit device thereon, a printed circuit board solder mask disposed circumferentially about the attachment pad, and one or more adhesion strips disposed between the attachment pad and the printed circuit board solder mask, the one or more adhesion strips extending around at least a portion of the attachment pad, the one or more adhesion strips configured to facilitate adhesion of a mold compound thereto and over the circuit device and to inhibit delamination of the mold compound.

18. The wireless device of claim 17 wherein the one or more adhesion strips include a single continuous adhesion strip that extends around an entire periphery of the attachment pad.

19. The wireless device of claim 17 wherein the one or more adhesion strips are a plurality of adhesion strips that are spaced from each other and extend around a periphery of the attachment pad.

20. The wireless device of claim 17 wherein the attachment pad has an area that is greater than a projected area of the circuit device.

21. The wireless device of claim 17 wherein the circuit device is chosen from a group consisting of a die, a surface mount technology package and a filter package.

22. The wireless device of claim 17 wherein the one or more adhesion strips are of a different material than the attachment pad.

23. The wireless device of claim 17 wherein the one or more adhesion strips include an etched or roughened surface.

24. The wireless device of claim 17 wherein the one or more adhesion strips are made of a metal material.

* * * * *